(12) United States Patent
Dutheil

(10) Patent No.: US 9,231,187 B2
(45) Date of Patent: Jan. 5, 2016

(54) ELECTRIC CONTACTOR HAVING SENSITIVE CONTROL

(75) Inventor: Daniel Dutheil, Meshers (FR)

(73) Assignee: Les ROBINETS PRESTO, Montrouge (FR)

( * ) Notice: Subject to any disclaimer, the term of this patent is extended or adjusted under 35 U.S.C. 154(b) by 659 days.

(21) Appl. No.: 13/579,740

(22) PCT Filed: Jan. 27, 2011

(86) PCT No.: PCT/FR2011/000038
§ 371 (c)(1),
(2), (4) Date: Nov. 27, 2012

(87) PCT Pub. No.: WO2011/101552
PCT Pub. Date: Aug. 25, 2011

(65) Prior Publication Data
US 2013/0069485 A1    Mar. 21, 2013

(30) Foreign Application Priority Data
Feb. 18, 2010 (FR) ...................................... 10 00673

(51) Int. Cl.
*H01L 41/113*  (2006.01)
*H03K 17/96*   (2006.01)

(52) U.S. Cl.
CPC .......... *H01L 41/1132* (2013.01); *H03K 17/964* (2013.01)

(58) Field of Classification Search
CPC ........ G01L 23/10; G01L 1/16; H01L 41/1132
USPC .................. 310/338, 339, 324, 348
See application file for complete search history.

(56) References Cited

U.S. PATENT DOCUMENTS

| | | | | |
|---|---|---|---|---|
| 6,064,141 A | * | 5/2000 | Wiciel | H03K 17/964 310/324 |
| 6,310,428 B1 | * | 10/2001 | Pulli | H01L 41/08 310/316.01 |
| 6,661,156 B1 | * | 12/2003 | Henneck | 310/328 |
| 2005/0275316 A1 | * | 12/2005 | Murata | B41J 2/14233 310/340 |
| 2007/0057604 A1 | * | 3/2007 | Aromin | H03K 17/964 310/348 |
| 2007/0247029 A1 | * | 10/2007 | Maruyama | H03H 9/0552 310/348 |
| 2010/0050991 A1 | * | 3/2010 | Cooke | 123/470 |

FOREIGN PATENT DOCUMENTS

| | | |
|---|---|---|
| DE | 203 01 325 U1 | 5/2003 |
| EP | 0 335 838 A2 | 10/1989 |
| WO | WO 98/36494 A1 | 8/1998 |

OTHER PUBLICATIONS

English Transaltion of WO 98/36494, Portmann.*

* cited by examiner

*Primary Examiner* — Shawki S Ismail
*Assistant Examiner* — Bryan Gordon
(74) *Attorney, Agent, or Firm* — Renner, Kenner, Greive, Bobak, Taylor & Weber

(57) ABSTRACT

Electrical contactor with touch control using a piezoelectric pellet incorporated in one face (2b) of a card (2) which is made of an insulating material and the other face (2a) of which comprises an electronic circuit, characterised in that said contactor comprises a metal casing (1), of which the bottom (5), which is thinned-down, constitutes a protective partition against which the first face (2b) is applied by the interposition of a tubular member (3), of which one end, which is elastically deformable, is applied against the periphery of the said card, the said casing and the said card comprising means which, together, bring about the holding of the said member (3) in position.

23 Claims, 4 Drawing Sheets

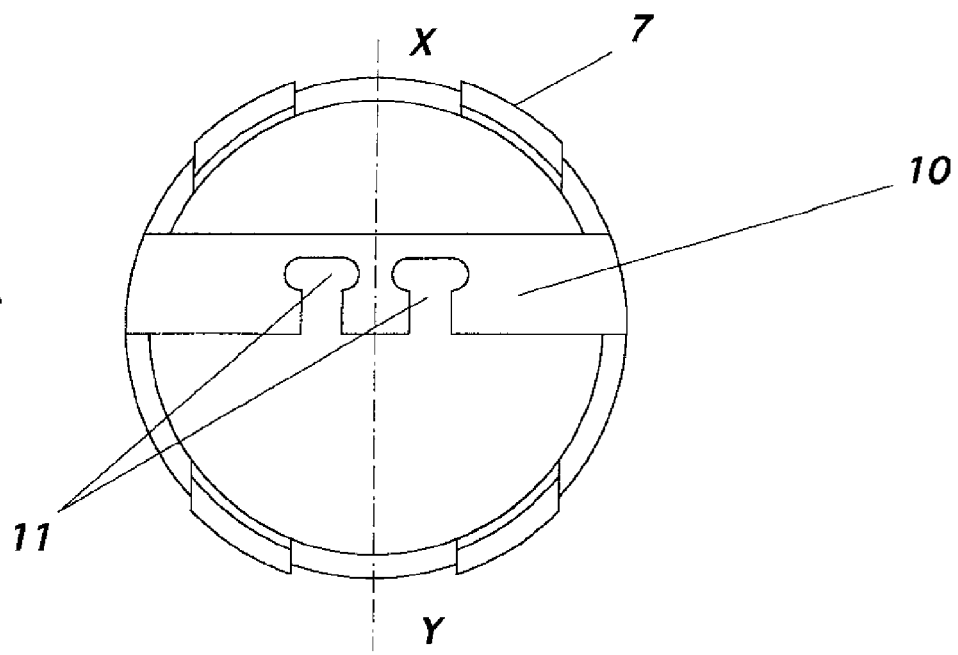
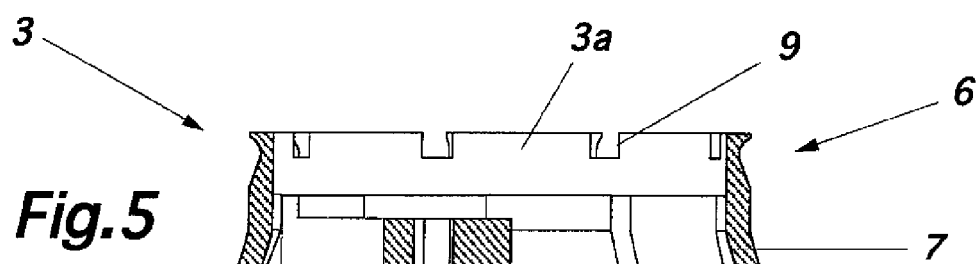
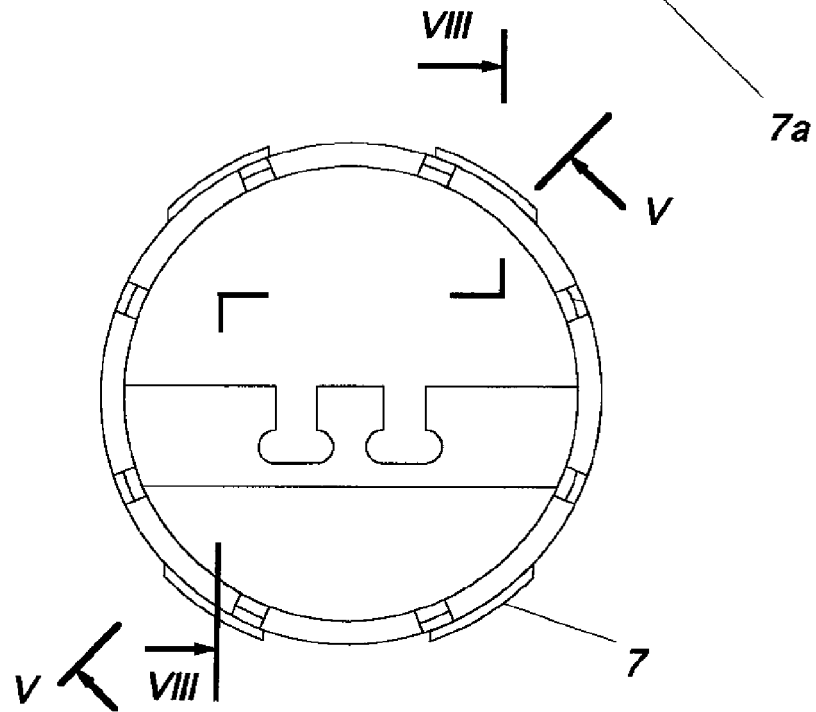

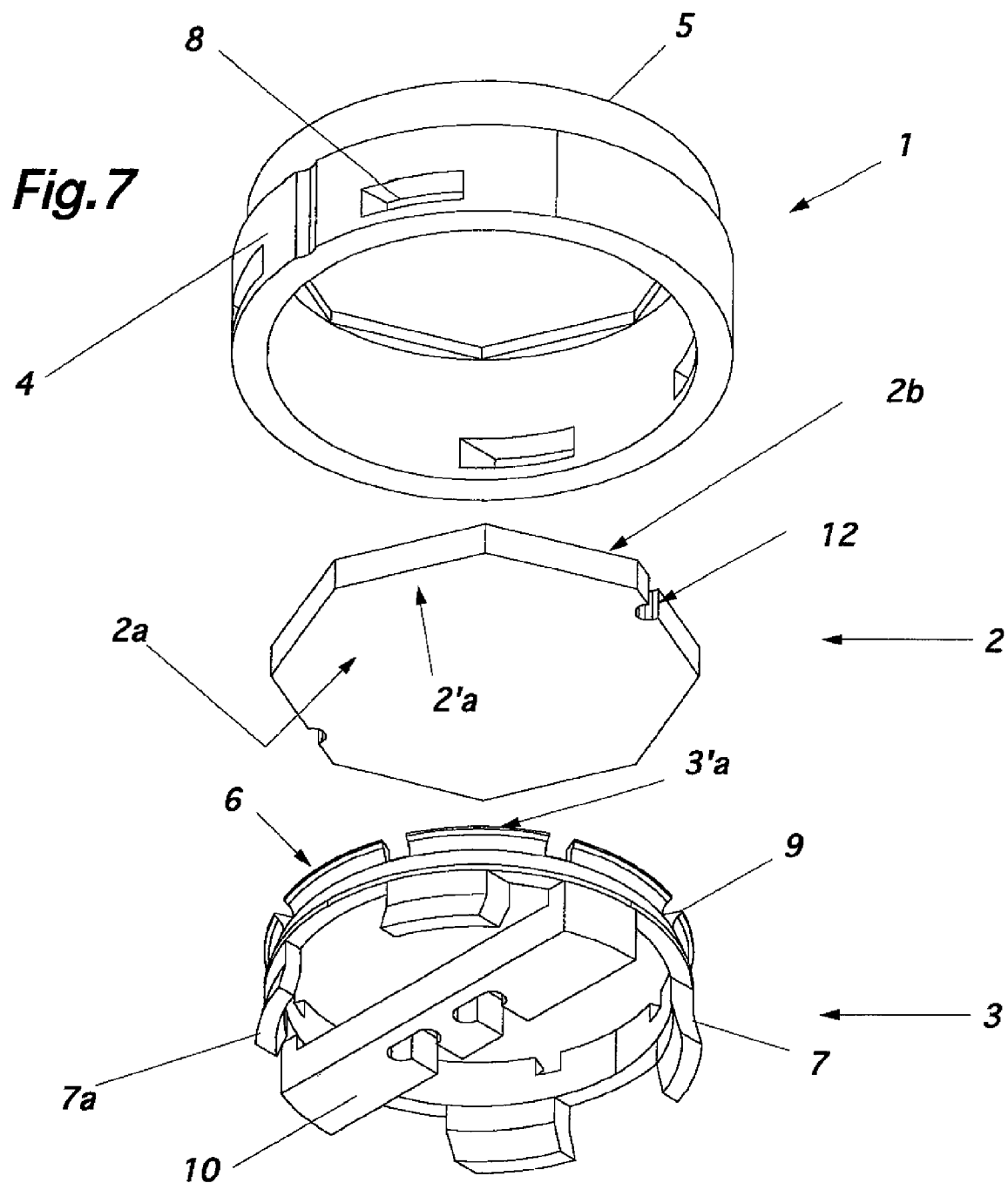

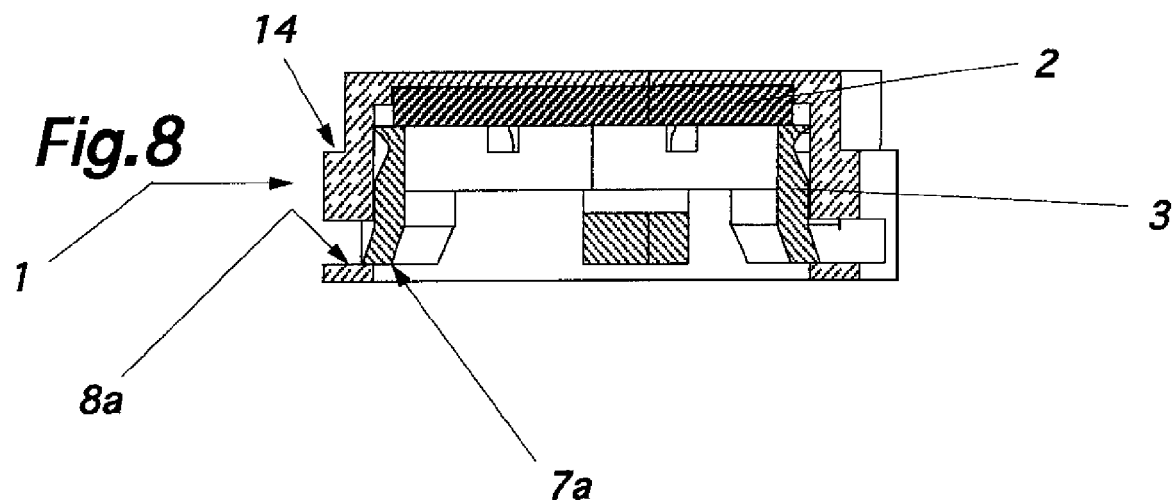
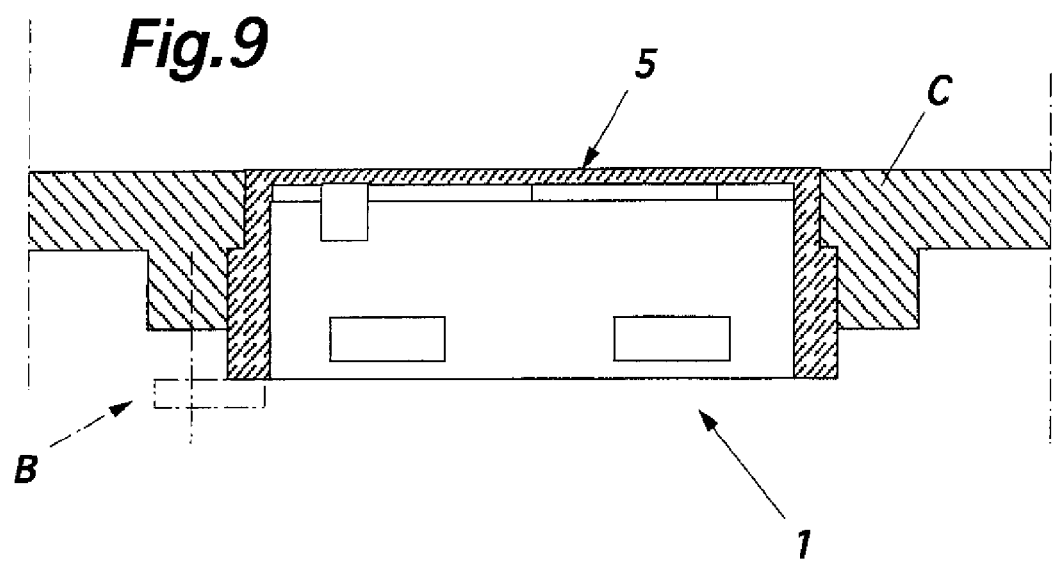
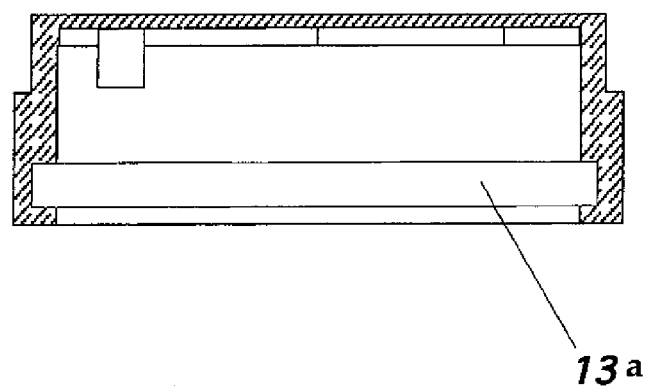

ELECTRIC CONTACTOR HAVING SENSITIVE CONTROL

The present invention relates to an electrical contactor with touch control, which is intended, more particularly but not exclusively, for controlling the electromagnetic valve of a tap.

The problem which has been posed consists in producing a contactor, the manufacture of which can be rationalised and which, when in use, is well protected against acts of vandalism.

The principle of operation of a contactor of this kind consists in applying a light pressure to a surface, which pressure is transmitted to a piezoelectric pellet which delivers a signal, the latter then being processed via an electronic circuit so as to obtain a predetermined control signal.

The components required for producing the electronic circuit are fixed to the face of a card which is made of an insulating material and against the other face of which the piezoelectric pellet is applied.

While the incorporation of the pellet in the electronic card poses no problem, the same does not apply as regards the production of the link between the face of the card comprising the pellet and the protective partition.

In the prior art, this link is produced by means of a double-sided adhesive. The card is applied under pressure against the protective partition and the pressure is maintained for a certain length of time in order for the bonding to become effective. Apart from the fact that it is awkward because of the presence of the electronic components, this procedure requires a certain length of time and this stoppage in the process for manufacturing the contactor is not acceptable from the viewpoint of an industrial manufacturing operation.

The contactor belonging to the invention is notable in that it comprises a metal casing, of which the bottom, which is thinned-down, constitutes the partition behind which is arranged the electronic card, which is kept applied against the partition by a tubular member, of which one end, which is elastically deformable, is applied against the periphery of the said card, the said casing and the said card comprising means which, together, bring about the holding of the said member in position.

The present invention will be more clearly understood by means of the description that follows, which is given with reference to the appended drawings, solely by way of an indicative example, in which drawings:

FIG. 4 is the view of the tubular locking member from above;

FIG. 5 is a view in section along the line V-V in FIG. 4;

FIG. 6 is a view of FIG. 4 from below;

FIG. 7 is an exploded view in perspective, showing the three elements that make up the contactor;

FIG. 8 is a view of the contactor in section (along the broken line VIII-VIII in FIG. 4);

FIG. 9 illustrates one way of utilising the contactor; and

FIG. 10 is a view similar to that of FIG. 2, showing a variant of embodiment.

Figure 3:
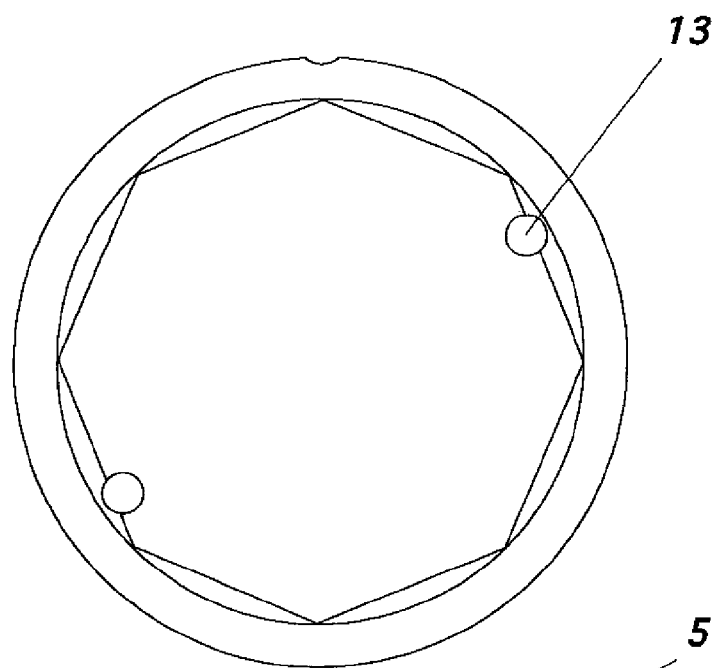
FIG. 3 is the view of the casing from below.
Figure 2:
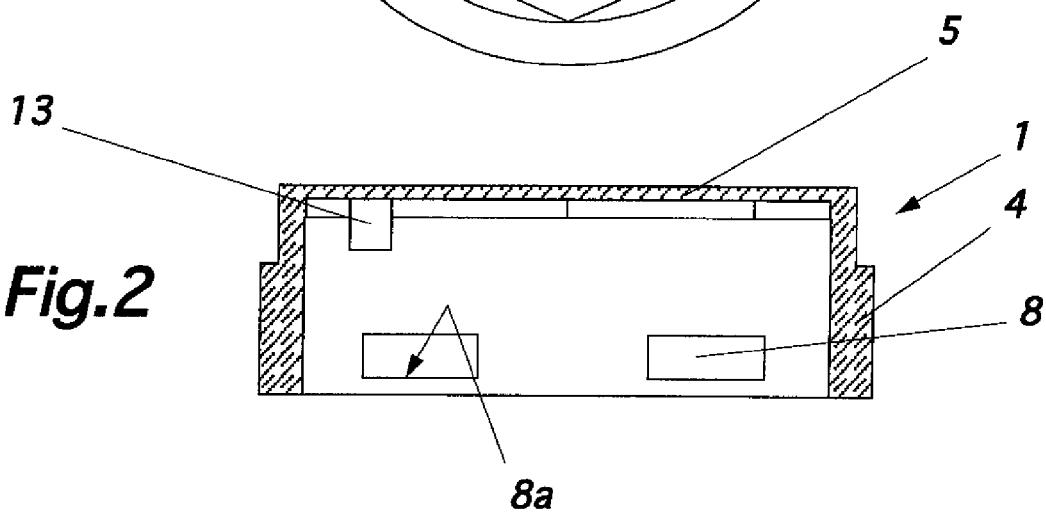
FIG. 2 is a view in section along the line II-II in FIG. 1.
Figure 1:
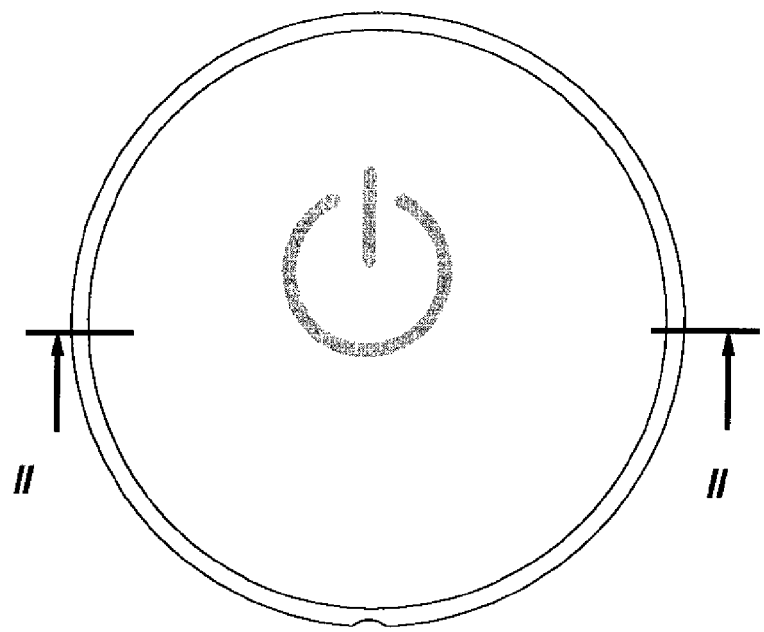
FIG. 1 is the view of the casing from above.

Referring to the drawings and according to one mode of embodiment (and especially to FIG. 7), it can be seen that the contactor comprises three parts 1, 2 and 3.

The part 1 is formed by a metal casing comprising a lateral jacket 4 and a bottom 5 which is sufficiently thin to be deformed under the effect of a light manual pressure.

According to one mode of embodiment, the casing assumes a circular shape.

The part 2 is constituted by a board, referred to below as a "card", which is made of an insulating material and comprises electronic components (not represented) on its face 2a and a piezoelectric pellet (not represented) on its face 2b which is normally applied against the internal face of the bottom 5, according to a known process.

It should be noted that the electric cables for supplying the electronic circuit and for emission of the control signal have not been represented, but are appropriately connected to the electronic circuit belonging to the face 2a.

The part 3, which constitutes the tubular member for holding the card 2 in position, assumes the shape of a circular ring and is made of an elastically deformable plastic material.

The end 6 of the ring 3, which is normally in contact with the card 2, is shaped so as to allow slight flattening under the effect of an axial thrust, and to exert a compressive pre-stress on the said card.

The external diameter of the ring 3 is smaller than the internal diameter of the part 1 of the casing. However, the ring 3 has at least one lug 7 which extends beyond the diameter of the said ring; the lug 7 extending substantially obliquely in relation to the axis of the ring in such a way that the distance that separates a point on the periphery of the said lug and the said axis increases from that end of the ring which is in contact with the card to the other end.

In this way, when the ring 3 is fitted into the casing 1, the lug 7 flexes elastically until the moment at which it is able to ease into a slot 8 provided in the part 4 of the said casing. In this position, the end 7a of the lug rests against the edge 8a of the slot and resists axial displacement of the ring and, consequently, axial displacement of the card 2 which is applied and held in position, without any play, against the internal face of the bottom 5.

As is apparent from the drawings, the ring 3 has two pairs of lugs arranged symmetrically in relation to a diametral plane (line at XY in FIG. 6), and the casing 1 therefore comprises four corresponding slots.

According to one feature of the invention, the card 2 assumes the shape of a regular octagon. It makes it possible to industrialise the manufacture of the circuits and especially to facilitate the cutting-out of the cards 2, which are initially produced on a single board comprising a plurality of identical circuits.

In order to ensure satisfactory contact between the end of the ring 3 and the periphery of the octagonal board, notches 9 are made on the end 6 of the said ring, delimiting portions 3a which each rest against the corresponding part of the board 2 (for example 3'a against 2'a—see FIG. 7).

The ring 3 is completed by a bar 10 comprising two slots 11 with a T-shaped section, which are used to guide the electric cables. The bar 10 extends in a direction perpendicular to the axis XY. This arrangement constitutes an advantageous visual reference point when clipping-in the ring 3, after the manner of an error-preventing device.

As regards error-prevention, it should be pointed out that the card 2 has, at its periphery, at least one notch 12 which is capable of cooperating with a finger 13 on the casing in order to position the said card and, consequently, the electric cables.

According to one mode of embodiment, the casing 1 has, at its periphery, a shoulder 14 which is capable of cooperating in the fixing of the contactor in a body C as shown in FIG. 9; flanges, such as are suggested at B in the said Figure, perform the holding function, and each flange may be constituted by an ordinary screw, the head of which rests under the lower edge of the said casing.

The casing which has just been described is obtained by injection, and that is the reason for the shape and arrangement of the slots 8. If this casing is obtained by machining, it is advantageous to replace the slots 8 by a groove 13a, as shown in FIG. 10.

The elasticity of the ring 3, and that of the layer of adhesive material interposed between the bottom of the casing and the corresponding face, is sufficient to maintain contact without any play. The geometry, dimensions and material of the ring 3 are defined in such a way that the value of the pre-stress exerted by said ring on the card 2 remains within the values defined, while gaining freedom from the dimensional tolerances inherent in the manufacture of the various pieces.

In the course of time, however, the materials may lose their properties, which is why the invention makes provision, when the three parts are assembled as shown in FIG. 8, for the face 2a of the card to be covered with a dual-component polyurethane resin which permits cold setting, for example, and which, on hardening, insulates the electronic circuit from moisture and holds the said card in position independently of the action of the clips ring 3.

The invention claimed is:

1. An electrical contractor using a piezoelectric pellet incorporated in one face of a card which is made of an insulating material and the other face of which includes an electronic circuit, characterized in that it comprises a metal casing, of which the bottom, which is sufficiently thin to be deformed under the effect of a light manual pressure, constitutes a protective partition against which the first face is applied by the interposition of a tubular member, of which one end, which is elastically deformable, is applied against the periphery of the said card, said casing and said card including means which, together, bring about the holding of said member, in position, wherein said tubular member has at least one lug which extends beyond the diameter of the said tubular member, substantially obliquely in relation to the axis of the tubular member in such a way that the distance that separates a point on the periphery of the said lug and the said axis increases from that end of said tubular member which is in contact with the card to the other end, and in that the casing has at least one slot, against an edge of which said end of said lug rests when the card is suitably applied under the bottom of the said casing.

2. An electrical contactor using a piezoelectric pellet incorporated in one face of a card which is made of an insulating material and the other face of which comprises an electronic circuit, characterized in that it comprises a metal casing, of which the bottom, which is sufficiently thin to be deformed under the effect of a light manual pressure, constitutes a protective partition against which the first face is applied by the interposition of a tubular member, of which one end, which is elastically deformable, is applied against the periphery of said card, said casing and said card comprising means which, together, bring about the holding of said tubular member, in position, wherein said tubular member has at least one lug which extends beyond the diameter of said tubular member, substantially obliquely in relation to the axis of said tubular member in such a way that the distance that separates a point on the periphery of the said lug and said axis increases from that end of said tubular member which is in contact with the card to the other end, and in that the casing has a peripheral groove.

3. Contactor according to claim 1, characterized in that the end of the tubular member which is in contact with the card has notches which delimit independent portions.

4. Contactor according to claim 1, characterized in that the card assumes the shape of a regular octagon.

5. Contactor according to claim 1, characterized in that the casing has a shoulder at its periphery.

6. Contactor according to claim 1, characterized in that, when the tubular member is locked in the casing, there is deposited on said tubular member a layer of polyurethane resin which, on hardening, insulates the electronic circuit from moisture and holds the card in position independently of the action of the tubular member.

7. Contactor according to claim 1, characterized in that the tubular member has at least two diametrically opposed lugs.

8. An electrical contactor with touch control using a piezoelectric pellet incorporated in one face of a card which is made of an insulating material and the other face of which comprises an electronic circuit, characterized in that it comprises a metal casing, of which the bottom, which is sufficiently thin to be deformed under the effect of a light manual pressure, constitutes a protective partition against which the first face is applied by the interposition of a tubular member, of which one end, which is elastically deformable, is applied against the periphery of the said card, the said casing and the said card comprising means which, together, bring about the holding of the said tubular member in position, wherein said tubular member is made of an elastically deformable material, and in that the end which is in contact with the card is shaped so as to allow slight flattening under the effect of an axial thrust, while maintaining a pre-stress, and wherein the tubular member has at least one lug which extends beyond the diameter of the said tubular member, substantially obliquely in relation to the axis of the tubular member in such a way that the distance that separates a point on the periphery of the said lug and the said axis increases from that end of the tubular member which is in contact with the card to the other end, and in that the casing has at least one slot, against the edge of which the end of the lug rests when the card is suitably applied under the bottom of the said casing.

9. An electrical contactor with touch control using a piezoelectric pellet incorporated in one face of a card which is made of an insulating material and the other face of which comprises an electronic circuit, characterized in that it comprises a metal casing, of which the bottom, which is sufficiently thin to be deformed under the effect of a light manual pressure, constitutes a protective partition against which ,he first face is applied by the interposition of a tubular member, of which one end, which is elastically deformable, is applied against the periphery of the said card, the said casing and the said card comprising means which, together, bring about the holding of the said tubular member in position, wherein said tubular member is made of an elastically deformable material, and in that the end which is in contact with the card is shaped so as to allow slight flattening under the effect of an axial thrust, while maintaining a pre-stress, and wherein the tubular member has at least one lug which extends beyond the diameter of the said tubular member, substantially obliquely in relation to the axis of the tubular member in such a way that the distance that separates a point on the periphery of the said lug and the said axis increases from that end of the tubular member which is in contact with the card to the other end, and in that the casing has a peripheral groove.

10. Contactor according to claim 1, characterized in that the end of the tubular member which is in contact with the card has notches which delimit independent portions.

11. Contactor according to claim 1, characterized in that the card assumes the shape of a regular octagon.

12. Contactor according to claim 2, characterized in that the card assumes the shape of a regular octagon.

13. Contactor according to claim 1, characterized in that, when the ring is locked in the casing, there is deposited on said ring a layer of polyurethane resin which, on hardening, insulates the electronic circuit from moisture and holds the card in position independently of the action of the tubular member.

14. Contactor according to claim 2, characterized in that the tubular member has at least two diametrically opposed lugs.

15. A touch controlled electrical contactor, comprising:
a casing having a bottom which is sufficiently thin to be deformed under the effect of a light manual pressure, said casing and said bottom being in one piece;
a card made of an insulative material housed in said casing, said card having a first face and an opposite second face, a piezoelectric pellet being incorporated into said first face and said second face including electronic components;
an elastically deformable tubular member having an end; and
means for applying and holding said end of said tubular member against said second face so as to hold said first face in contact against an internal face of said casing bottom.

16. The contactor of claim 15, wherein said end of said tubular member in contact with said card second face is shaped so as to allow slight flattening under the effect of an axial thrust, while maintaining a pre-stress.

17. The contactor of claim 15, wherein said tubular member includes at least one lug extending beyond the diameter of said tubular member substantially obliquely relative to said axis of said tubular member, such that a distance separating a point at the periphery of said at least one lug and said axis increases from said end of said tubular member in contact with said card toward an opposite end, said casing including at least one slot against an edge thereof where said lug rests when said card first face is applied against said bottom.

18. The contactor of claim 15, wherein said tubular member includes at least one lug extending beyond the diameter of said tubular member substantially obliquely relative to said axis of said tubular member, such that a distance separating a point at the periphery of said at least one lug and said axis increases from said end of said tubular member in contact with said card toward an opposite end, said casing including a peripheral groove against an edge thereof where said lug rests when said card first face is applied against said bottom.

19. The contactor of claim 15, wherein said end of said tubular member in contact with said second opposite face of said card includes notches delimiting independent portions.

20. The contactor of claim 15, wherein said card has the shape of a regular octagon.

21. The contactor of claim 15, wherein said casing comprises a shoulder at its periphery.

22. The contactor of claim 15, wherein a hardened layer of polyurethane resin is deposited on said tubular member so as to insulate said electronic component from moisture.

23. The contactor of claim 18, wherein said tubular member includes at least two diametrically opposed lugs.

\* \* \* \* \*